US008828255B2

(12) United States Patent
Baillet et al.

(10) Patent No.: US 8,828,255 B2
(45) Date of Patent: *Sep. 9, 2014

(54) METHOD FOR ETCHING A MATERIAL IN THE PRESENCE OF A GAS

(75) Inventors: Francis Baillet, Paladru (FR); Nicolas Gondrexon, Meylan (FR)

(73) Assignees: Institut Polytechnique de Grenoble, Grenoble Cedex (FR); Universite Joseph Fourier, Saint Martin d'Heres (FR)

( * ) Notice: Subject to any disclaimer, the term of this patent is extended or adjusted under 35 U.S.C. 154(b) by 65 days.

This patent is subject to a terminal disclaimer.

(21) Appl. No.: 13/320,671

(22) PCT Filed: May 12, 2010

(86) PCT No.: PCT/FR2010/050927
§ 371 (c)(1),
(2), (4) Date: Feb. 28, 2012

(87) PCT Pub. No.: WO2010/133786
PCT Pub. Date: Nov. 25, 2010

(65) Prior Publication Data
US 2012/0145670 A1    Jun. 14, 2012

(30) Foreign Application Priority Data

May 18, 2009 (FR) ..................... 09 53293

(51) Int. Cl.
C03C 15/00 (2006.01)
C23F 1/00 (2006.01)
H01L 21/311 (2006.01)
H01L 21/3213 (2006.01)

(52) U.S. Cl.
CPC ............ *H01L 21/31111* (2013.01); *C23F 1/00* (2013.01); *H01L 21/32134* (2013.01)
USPC ...... 216/63; 156/345.11; 252/79.1; 252/79.2; 252/79.3; 252/79.4

(58) Field of Classification Search
USPC ............... 216/63; 156/345.11; 252/79.1–79.4
See application file for complete search history.

(56) References Cited

U.S. PATENT DOCUMENTS

| 5,823,210 A * | 10/1998 | Inada et al. ................... 134/105 |
| 7,931,786 B2 * | 4/2011 | Wilson et al. ................. 204/273 |
| 2004/0226654 A1 * | 11/2004 | Hongo et al. ............. 156/345.11 |

FOREIGN PATENT DOCUMENTS

| EP | 0844650 A2 | 5/1998 |
| FR | 2923947 A1 | 5/2009 |

OTHER PUBLICATIONS

Form PCT/ISA/210, Oct. 5, 2010, ISR for PCT/FR2010/050927.
Chen J. et al., "Study of anisotropic etching of (1 0 0) Si with ultrasonic agitation", Sensors and Actuators A., Elsevier Sequoia S.A., Lausanne, CH, vol. 96, No. 2-3, Feb. 28, 2002, pp. 152-156.

* cited by examiner

*Primary Examiner* — Lan Vinh
*Assistant Examiner* — Maki Angadi
(74) *Attorney, Agent, or Firm* — Edwards Wildman Palmer LLP; Steven M. Jensen; Stephen W. Rafferty

(57) ABSTRACT

The invention relates to a method for etching a structure (1) including at least one material (4) to be etched, said method consisting in: selecting at least one chemical species that can react with the material (4) to be etched; selecting at least one soluble compound that can release this chemical species; producing a solution (11) containing said compound; placing the structure (1) in a position such that the surface of the material to be etched is in the presence of the solution and additional bubbles of a gas; and producing high-frequency ultrasounds in the solution, at at least one frequency, capable of generating reactive cavitation bubbles such that the chemical species is generated in the presence of these additional bubbles and reacts with the material to be etched, thereby producing a soluble compound or a precipitate.

13 Claims, 2 Drawing Sheets

METHOD FOR ETCHING A MATERIAL IN THE PRESENCE OF A GAS

CROSS-REFERENCE TO RELATED APPLICATIONS

This application is the U.S. national phase, pursuant to 35 U.S.C. §371, of PCT international application Ser. No. PCT/FR2010/050927, filed May 12, 2010, designating the United States and published in English on Nov. 25, 2010 as publication WO 2010/133786 A1, which claims the benefit of French Application Ser. No. 0953293, filed May 18, 2009, the entire contents of each of which are expressly incorporated herein by reference.

BACKGROUND OF THE INVENTION

The present invention relates to the field of etching a material.

The present invention may relate more particularly to the field of the production of semiconductor components, in which, during production, numerous steps are generally provided for selectively etching one material relative to another or others, to the field of recovering semiconductor substrates having defects, in which it is desired to remove a surface layer in order to recover a subjacent substrate, possibly already provided with a certain number of layers formed in a suitable way, and to the field of improving the surface state of a layer of a material.

Generally, when it is desired to remove a layer deposited on a substrate in a selective manner relative to another layer, after having possibly masked part of the layer to be removed if it is desired to remove only part thereof, two main methods exist in the field of the fabricating semiconductor components.

The first family of methods consists of "wet" etching in which the structure, one layer of which is to be etched, is immersed in an etchant, typically one based on hydrochloric or hydrofluoric acid. Several mixtures have been developed for allowing selective etching of one layer relative to another, for example a silicon oxide layer relative to a silicon nitride layer, a silicon oxide layer relative to silicon, or a metal layer relative to an insulating layer.

Within this family, document US-A-6 746 967 describes a method for oxidizing nickel in an oxidizing solution at a controlled pH. Simply to accelerate oxidation, the presence of low-frequency ultrasound modifies the energy barrier necessary the nickel to be etched by the solution.

The second family of methods, called. "dry" etching, consists of placing the structure carrying the layer to be removed in a plasma containing etchants, for example radical chemical species or active radicals of chlorine, fluorine, oxygen etc.

The second family of methods has many advantages compared with the first, notably from the fact that it permits anisotropic attack and that it often has better etching selectivity between two materials. However, it has the disadvantage of requiring complex equipment and, in the case where the layer to be etched is carried by a silicon substrate, of only making it possible to treat one or two silicon substrates at the same time. On the other hand, although the first family of methods is often impossible to put into practice when it is desired to perform highly selective etching of one material relative to another material, it has the advantage of allowing batch treatments, it being possible for many wafers to be placed in a boat and then immersed in the etching solution.

Various variants of these two families of methods are known to a person skilled in the art. For example, as regards the "wet" etching method, it is sometimes proposed to improve the result by applying an electric field between the material to be etched and the etching solution.

A third family of methods, more generally used for cleaning and degreasing surfaces, consists of immersing the surface in a cleaning bath, for example an alcohol bath, and of applying sound vibrations to the liquid medium at relatively low sound frequencies, usually of the order of 20 to 45 kHz. The vibrations then assist in detaching dirt particles from the surface to be cleaned.

In addition, in "wet" etching methods, mixers are normally used to circulate the etching liquid over the surface of the material to be etched, and possibly low-frequency sound waves, between 1 and 40 kHz, in order to improve mixing. For example, in document US-A-4 544 066, the solution is agitated by low-frequency ultrasound in order to even out the reaction over the surface.

BRIEF SUMMARY OF THE INVENTION

One subject of the present invention is a method for etching a structure including at least one material to be etched.

There is proposed a method for etching a structure including at least one material to be etched, which comprises:
  choosing at least one chemical species capable of reacting with the material to be etched;
  choosing at least one soluble compound that does not react with said material but which is able to release the aforementioned chemical species;
  producing a solution containing said compound;
  placing the structure in a position such that the surface of the material to be etched is in the presence of the solution and of additional bubbles of a gas; and
  producing high-frequency ultrasound in the solution with at least one frequency capable of generating reactive cavitation bubbles, in the presence of said additional bubbles, such that the chemical species is generated and reacts with the material to be etched, while producing a soluble compound or a precipitate.

In the context of the present invention, the term "chemical species capable of reacting with the material to be etched" is understood to mean an atomic chemical species and/or a molecular chemical species and/or an ionic chemical species and/or a radical chemical species.

The interface between the solution and the gas may be formed at least in part by the physical surface of the solution, above which occurs the gas, the surface to be etched of the material to be etched being placed in touch with the physical surface of the solution and turned in the direction of the solution.

The physical surface of the solution may be perturbed or agitated.

The surface to be etched of the material to be etched may be immersed in the solution.

The additional gas bubbles may be contained, dispersed or generated in the solution.

The gas bubbles may result from injection of the gas into the solution.

The additional gas bubbles may be generated under the effect of a low-frequency ultrasound emitter.

The low-frequency ultrasound may have a frequency of less than 50 kHz.

The frequency of the high-frequency ultrasound may be at least 10 times greater than the frequency of the low-frequency ultrasound.

The high-frequency ultrasound frequency may lie between 100 kHz and 3 MHz.

The high-frequency ultrasound frequency may lie between 200 kHz and 600 kHz.

For the selective etching of a structure comprising at least one first material to be etched and at least one second material, the chosen chemical species and the soluble compound may not react with the second material.

The period during which high-frequency ultrasound is produced may be determined in order totally or partially to remove the material to be etched, in order to reduce the surface roughness of the material to be etched or in order to reduce the thickness of the material to be etched.

DETAILED DESCRIPTION OF THE INVENTION

The present invention will now be described in greater detail through the description of particular embodiments, as nonlimiting examples, in relation to items of etching equipment represented diagrammatically in the appended drawing, in which:

Figure 1:
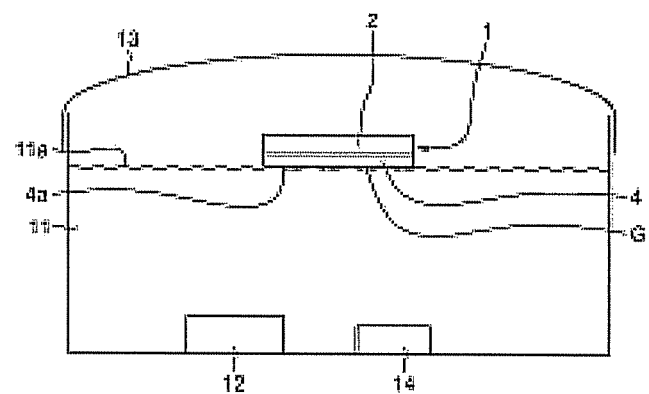
FIG. 1 represents a vertical cross section of an item of equipment, a structure to be etched being placed above a solution.

An item of equipment has been represented in FIG. 1 which comprises a basin or chamber 10 which contains a liquid solution 11 and an ultrasound emitter 12 or other source of sound waves, at least partially introduced into the solution 11, capable of generating high-frequency ultrasonic waves in this solution 11, in order to produce reactive cavitation bubbles in the solution 11.

A structure 1 including, for example, a layer 2 on which is formed a layer 4 made of a material to be etched is placed in a position such that a surface 4a to be etched of this layer 4 is placed substantially in touch with the physical surface 11a of the solution 11, above which is found a gas G, the surface 4a being turned towards the bottom in the direction of the solution 1.

More specifically, the surface 4a to be etched of the layer 4 is placed in such away that, when the physical surface 11a of the solution 11 is stable, there exists a chink between this physical surface 11a and the surface 4a to he etched, this chink containing the gas G.

According to one example, the physical surface 11a of the solution 11 may be in the open air, so that the gas G is air.

According to another example, the basin or chamber 10 may comprise a lid 13 and may thus contain, above the physical surface 11a of the solution 11, a chosen gas G other than air.

When the high-frequency ultrasound emitter 12 is activated, reactive cavitation bubbles are generated in the solution 11, as will be described later, and more particularly in its surface layer. These reactive cavitation bubbles agitate the physical surface 11a of the solution 11, so that the solution comes into contact with the surface 4a of the material to be etched 4 and so that this surface to be etched 4a is in the presence of the interface between the solution and the gas G, this gas G taking the form of additional bubbles different from the cavitation bubbles. Additional gas bubbles may also be introduced into the surface layer of the solution 11.

In addition, a stirrer 14 of the solution 11 might be added in order to bring about an increase in the agitation of the physical surface 11a of the solution 11.

Figure 2:
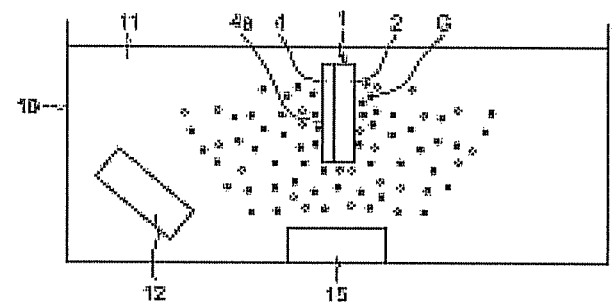
FIG. 2 represents a vertical cross section of an item of equipment, a structure to be etched being immersed in a solution.

An item of equipment has been represented in FIG. 2 which also comprises a basin or chamber 10 which contains a liquid solution 11 and an ultrasound emitter 12 or other source of sound waves, at least partially introduced into the solution 11, capable of generating high-frequency ultrasonic waves in this solution 11, in order to produce reactive cavitation bubbles in the solution 11.

A structure 1 also including, for example, a layer 2 on which is formed a layer 4 made of a material to be etched is at least partially immersed in the solution 11 in a position such that a surface 4a to be etched of the layer 4 is immersed in the solution 11, this surface 4a to be etched being preferably placed vertically or in a sloping fashion.

The other surfaces of the layer 4 and the other surfaces of the structure which must not be attacked are unable to be attacked or are protected, for example via a mask.

The item of equipment of FIG. 2 additionally comprises a generator 15 of bubbles of gas G different from the reactive cavitation bubbles.

According to one example, a generator 15 may be formed by a low-frequency ultrasound emitter, with a frequency of less than 50 kHz, generating, by cavitation, additional bubbles of gas G in the solution 11. The frequency of the high-frequency ultrasound may be at least equal to 10 times the frequency of the low-frequency ultrasound. The lifetime of the additional bubbles is notably longer than the lifetime of the reactive cavitation bubbles.

According to another example, a generator 15 may be formed by an injector of additional bubbles of a chosen gas G.

In the above cases, the additional bubbles of gas G produced in the solution 11 exhibit a markedly greater volume than that of the reactive cavitation bubbles generated, for example at least 100 times greater, indeed even several hundred times greater.

In that way, the surface 4a to be etched of the material 4 may be in the presence of additional bubbles of gas G, against its immersed surface 4a to be etched and close to this surface.

A description will now be given of examples relating to materials to be etched and solutions suitable for the etching of materials relative to other materials not to be etched, the item of equipment of FIG. 1 or that of FIG. 2 being employed.

In these examples, for writing reasons, the chemical species capable of reacting, which could have been marked by a "point", are marked by a superscript "o".

EXAMPLE 1

Figure 3:
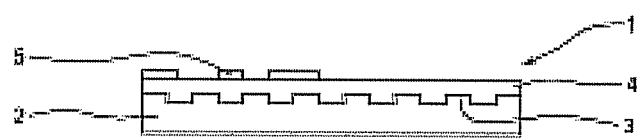
FIG. 3 represents another structure to be etched.

The structure 1, as represented in FIG. 3, may comprise a silicon substrate 2 coated with an insulating layer 3, for example a layer of silicon oxide etched in a certain pattern so as to exhibit inequalities in thickness, for example in a checkered pattern, and covered with a layer of copper 4. Normally, in practice, an intermediate tie layer, for example a layer of titanium nitride TiN, is deposited at the interface between the oxide layer 3 and the copper layer 4.

As an example of the order of magnitude, the silicon substrate 2 may have a thickness of several hundreds of μm and the copper layer 4 may have a thickness of the order of 1 μm.

In a variant shown in the right-hand part of FIG. 3, an attempt may be made to remove the copper layer 3 completely so as to recover the subjacent substrate.

According to another variant shown on the left-hand part of FIG. 3, an attempt may be made to remove part of the layer 4 locally that is unprotected by a mask 5, in order to perform an intermediate step for producing a semiconductor device.

In order to etch the copper layer 4 of the structure 1 in the solution 11, it is possible to make the following choices.

A solution 11 may be chosen containing molecules that do not etch copper or silicon or the mask and are capable of releasing a chemical species capable of reacting with copper without this chemical species reacting with silicon and with the material of which the mask is made.

High-frequency ultrasonic sound waves may be chosen that are able to generate reactive cavitation bubbles, namely sound waves having a frequency above 100 kHz, for example between 100 kHz and 3 MHz, preferably between 200 kHz and 3 MHz, and even more preferably of the order of 200 to 600 kHz. Within these frequency ranges, the size of the reactive cavitation bubbles may reach values of the order of 1 μm for frequencies of the order of 400 kHz and fall again to values of the order of 0.1 μm for frequencies of the order of 1 MHz.

According to a particular example, in order to attack the copper layer 4, a solution of HCl may be chosen at 1 mole per liter and an ultrasound emitter 12 may be chosen providing sound waves at a frequency of the order of 400 kHz and at a power of the order of 300 watts.

Under these conditions, reactive cavitation bubbles that have a very short duration of existence, in which the pressures may reach values of the order of several atmospheres and the temperatures may be close to several thousands of degrees, are generated, notably and more particularly at the surface of the wafer 1, and bring about the formation of the radical chemical species Cl° from molecules of HCl. The chemical species Cl° produced reacts with copper, producing CuCl or $CuCl_2$.

The etching obtained is quite specific to the phenomenon of creating the active chemical species Cl°. In point of fact, copper in contact with an HCl solution with the same concentration does not react.

For the thicknesses indicated above, complete removal of the metallic copper layer 4 could be obtained, totally or locally, without the silicon oxide layer 3 being etched, that is to say without etching that could be greater than approximately one nanometer.

EXAMPLE 2

Using a structure 1 including a silicon wafer 2 carrying a silicon oxide layer 4, an attempt may be made to remove this silicon oxide layer.

Using a solution 11 of NaOH (sodium, hydroxide) at 1 mole per liter, sound waves at a frequency of the order of 400 kHz and a power of the order of 300 watts are emitted into this solution.

Under these conditions, as in the previous example, reactive cavitation bubbles generated in the solution, notably and more particularly at the surface of the wafer 1, bring about the formation of the radical chemical species OH° from NaOH molecules. The chemical species OH° produced reacts with silicon oxide producing $Na_2SiO_4$.

The layer of silicon oxide may be removed without any etching of the subjacent silicon.

EXAMPLE 3

Using a silicon wafer carrying a copper layer as in example 1 or a layer of silicon oxide as in example 2, an attempt may be made to reduce the roughness of the surface of this layer.

To this end, the conditions of example 1 or of example 2 may for example be employed respectively, but the action of the high-frequency ultrasound emitter 12 is limited in duration so that only the material constituting the rough regions or asperities is at least partially etched.

Attack of the rough regions is more effective as the density of the cavitation bubbles increases at the ends of these rough regions or asperities.

EXAMPLE 4

Using a wafer 1 having a copper layer as in example 1 or a silicon oxide layer as in example 2, an attempt may be made to reduce the thickness of this layer.

To this end, it is possible to employ for example the conditions of example 1 or of example 2, but the duration of the action of the high-frequency ultrasound emitter 12 is limited and controlled so that the remaining thickness of the layer reaches a desired value.

Considering the previous examples, a more specific description will now follow of the selective etching of a first material 4 relative to a second material 2 of a structure 1, while making the following provisions.

A chemical species is chosen that is capable of reacting with the first material to be etched and of not reacting with the second material.

A soluble compound is chosen that does not etch the materials and is capable of releasing the selected chemical species.

Having prepared a solution containing this compound and having immersed the structure in the solution, ultrasound is produced in the solution, at a frequency capable of generating cavitation bubbles.

The result is that reactive cavitation bubbles, in which pressures reach values of the order of several atmospheres and the temperature approaches several thousands of degrees, bring about the production, in the solution and notably in the vicinity of the solid surface to be treated, of the chosen chemical species that reacts selectively with the first material producing a soluble compound or precipitate, without etching the second material.

In order to select the suitable chemical species and the suitable soluble compound, a person skilled in the art will know how to use for example the "FactSage" software containing the European SGTE database so as to determine a chemical species likely to react with a first material to produce a soluble compound or one that can easily crumble away, or a precipitate, this chemical species not reacting with a second material.

The SGTE database is not the only thermodynamic database available to a person skilled in the art. Other existing bases exist such as for example the "Thermo-Calc" software. In order to access the "Thermo-Calc" or "FactSage" software, it is sufficient to connect to the following websites: http://www.thermocalc.com; www.factsage.com; www.gtt-technologies.com.

These bases serve to support software programs which, by minimizing the Gibbs energy, are capable of giving thermodynamically stable compounds that will be formed by chemical reaction from a given starting mixture. "Thermodynamically stable" is understood to mean a product that would be obtained after an infinite reaction time. The following may for example be observed.

a starting mixture of silica+solid copper+HCl diluted to 1 mole per liter does not change (remains stable). If it is added into the calculation that Cl° radicals or radical chemical species exist in solution, solid copper will be transformed completely into $CuCl_2$ and $Cu^{2+}$ but silica will not change;

a starting mixture of silicon+silica and sodium hydroxide at 1 mole per liter is a thermodynamically stable mixture (no change). If it is added to the calculation that the radical chemical species OH° or Na° are to be formed in solution, the thermodynamic software shows that silica will be converted into the solid compound $H_4SiO_4$ while silicon will remain stable.

A person skilled in the art will know how to determine what chemical species may form in a given solution and how to test, by using the abovementioned software, what phases (compounds or pure bodies) will be stable in solution and which will change by chemical reaction.

The following examples may be noted for choosing a chemical species intended to etch a first material without etching a second material of a wafer.

The chemical species OH° may be active for etching Si, without etching SiGe.

The chemical species H° may be active for etching $InSnO_3$, without etching $SiO_2$.

The chemical species Cl° may be active for etching Cu, without etching $SiO_2$.

The chemical species F° may be active for etching Si, without etching a polymer.

The chemical species Cl° may be active for etching Au, without etching an AlN ceramic.

The chemical species OH° or the chemical species Cl° may be active for etching Al, without etching $Al_2O_3$.

The chemical species OH° may be active for etching W, without etching $Al_2O_3$.

The chemical species Cl° may be active for etching Cu, without etching $SiO_2$ or a TiN ceramic.

The chemical species H° or the chemical species Cl° may be active for etching $InSnO_2$, without etching a polymer or a glass.

The chemical species Na° or the chemical species F° may be active for etching $SiO_2$, without etching Al.

The chemical species H° or the chemical species F° may be active for etching $Al_2O_3$, without etching W.

The chemical species Br° may be active for etching TiN, without etching $SiO_2$.

The chemical species K° may be active for etching $Si_3N_4$, without etching SiO or a polymer.

The chemical species Cl° may be active for etching a TaN ceramic, without etching $SiO_2$.

In addition, a person skilled in the art will know, by simple tests, how to determine in each particular case the concentration of the chosen solution, the optimum frequency and optimum power of the ultrasound so that the effect of the cavitation bubbles produced will bring about the desired etching, as well as the duration of treatment to be applied to the first material to be etched.

Note may be taken of the great simplicity of the implementing method as well as the fact that a batch of structures 1 may be treated simultaneously in the same solution.

Figure 4:
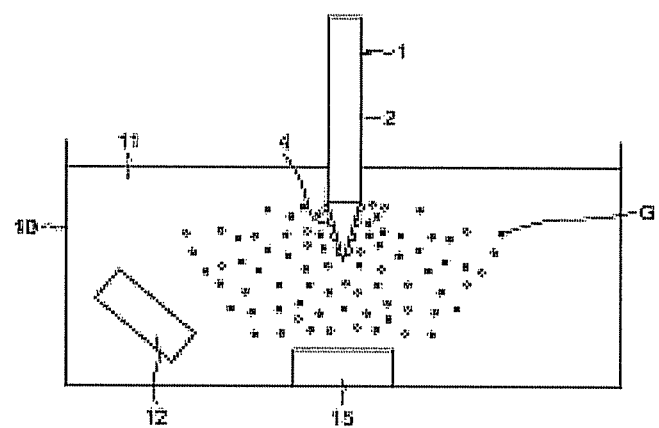
FIG. 4 represents another structure to be etched immersed in the item of equipment of FIG. 2.

In another example represented in FIG. 4, the proposal is made to carry out the cleaning of the ends of electrical contact points 2 tarnished by a deposit of particles 4 to be removed, in particular the chemical etching of aluminum particles deposited on or attached to tungsten probes used for testing electronic chips, the tarnished ends of the points 2 being dipped into a solution 11 of the item of equipment of FIG. 2. In this case, an NaCl solution may be chosen which etches neither aluminum nor tungsten but which could release Cl° chemical species in order to etch the aluminum without etching the tungsten.

In all the etching examples which have just been described, a description will now be given of the effects of the additional bubbles of gas G mentioned above.

The additional bubbles of gas G are found in the presence of the cavitation bubbles. Cavitation bubbles may be found in contact with the additional bubbles of gas G and may be mixed with the additional bubbles of gas G. The additional bubbles of gas G have a markedly greater lifetime than that of the active cavitation bubbles.

The main effect of the additional bubbles of gas G is to notably increase the rate of etching of the material to be etched, in particular for the following reasons.

The main effect is to increase the surface area of contact between the gas bubbles and the solution. As it is known that, in this interfacial region, the exchanges or transfers of chemical species between the additional gas G and the solution are enhanced, the chemical species created in the cavitation bubbles are more numerous for the etching of the material to be etched.

The additional gas participates in the reaction chemically and/or by modifying chemical reaction parameters.

The chosen gas G may participate in the etching by introducing a suitable chemical compound. For example, the oxygen of the air chosen as gas G may greatly contribute to the etching of silicon (Si), aluminum (Al) or tungsten (W). In other examples, hydrogen chloride (HCl) chosen as gas G may greatly contribute to the etching of copper (Cu) or aluminum (Al).

In the case where the chosen gas G contains argon (Ar), which may be capable of modifying chemical reaction parameters, the active cavitation bubbles become much more energetic.

The invention claimed is:

1. A method for etching a structure comprising at least one material to be etched, comprising:
   choosing at least one chemical species capable of reacting with the material to be etched;
   choosing at least one soluble compound that does not react with said material but which is able to release the aforementioned chemical species;
   producing a solution containing said compound;
   placing the structure in a position such that the surface of the material to be etched is in the presence of the solution and of additional bubbles of a gas (G); and
   producing high-frequency ultrasound in the solution with at least one frequency capable of generating reactive cavitation bubbles, in the presence of said additional bubbles such that said cavitation bubbles are in contact with and mixed with said additional bubbles, such that the chemical species is generated and reacts with the material to be etched, while producing a soluble compound or a precipitate.

2. The method as claimed in claim 1, in which the interface between the solution and the gas is formed at least partially by the physical surface of the solution, above which occurs the gas, and in which the surface to be etched of the material to be etched is placed in touch with the physical surface of the solution and turned in the direction of the solution.

3. The method as claimed in claim 2, in which the physical surface of a solution is perturbed or agitated.

4. The method as claimed in claim 1, in which the surface to be etched of the material to be etched is immersed in the solution.

5. The method as claimed in claim 1, in which the additional gas bubbles are contained, dispersed or generated in the solution.

6. The method as claimed in claim 1, in which the gas bubbles result from the injection of the gas into the solution.

7. The method as claimed in claim 1, in which the additional gas bubbles are generated under the effect of a low-frequency ultrasound emitter.

8. The method as claimed in claim 7, in which the low-frequency ultrasound has a frequency of less than 50 kHz.

9. The method as claimed in claim 7, in which the frequency of the high-frequency ultrasound is at least ten times greater than the frequency of the low-frequency ultrasound.

10. The method as claimed in claim 1, in which the high-frequency ultrasound frequency lies between 100 kHz and 3 MHz.

11. The method as claimed in claim 1, in which the high-frequency ultrasound frequency lies between 200 kHz and 600 kHz.

12. The method as claimed in claim 1, for the selective etching of a structure comprising at least one first material to be etched and at least one second material, in which the chosen chemical species and the soluble compound do not react with the second material.

13. The method as claimed in claim 1, in which the period during which high-frequency ultrasound is produced is determined in order totally or partially to remove the material to be etched, in order to reduce the surface roughness of the material to be etched or in order to reduce the thickness of the material to be etched.

* * * * *